(12) United States Patent
Nasser-Faili

(10) Patent No.: US 9,679,764 B2
(45) Date of Patent: Jun. 13, 2017

(54) SEMICONDUCTOR DEVICE STRUCTURES COMPRISING POLYCRYSTALLINE CVD DIAMOND WITH IMPROVED NEAR-SUBSTRATE THERMAL CONDUCTIVITY

(71) Applicant: RFHIC Corporation, Anyang (KR)

(72) Inventor: Firooz Nasser-Faili, Santa Clara, CA (US)

(*) Notice: Subject to any disclaimer, the term of this patent is extended or adjusted under 35 U.S.C. 154(b) by 0 days.

(21) Appl. No.: 15/356,881

(22) Filed: Nov. 21, 2016

(65) Prior Publication Data

US 2017/0084450 A1 Mar. 23, 2017

Related U.S. Application Data

(62) Division of application No. 14/909,791, filed as application No. PCT/US2014/053544 on Aug. 29, 2014, now Pat. No. 9,548,257.

(Continued)

(51) Int. Cl.
*H01L 23/373* (2006.01)
*H01L 21/02* (2006.01)
(Continued)

(52) U.S. Cl.
CPC ...... *H01L 21/0228* (2013.01); *C23C 16/0245* (2013.01); *C23C 16/0254* (2013.01); *C23C 16/0272* (2013.01); *C23C 16/27* (2013.01); *H01L 21/0262* (2013.01); *H01L 21/02115* (2013.01); *H01L 21/02389* (2013.01); *H01L 21/02444* (2013.01); *H01L 21/02488* (2013.01); *H01L 21/02513* (2013.01); *H01L 21/02527* (2013.01); *H01L 21/02658* (2013.01);
(Continued)

(58) Field of Classification Search
CPC .......... H01L 23/3732; H01L 21/02488; H01L 21/02513; H01L 21/02389; H01L 21/02444; H01L 21/0262; H01L 21/02658; H01L 21/02527; C23C 16/0254; C23C 16/0245; C23C 16/27; C23C 16/0272
See application file for complete search history.

(56) References Cited

U.S. PATENT DOCUMENTS 7,837,793 B2 * 11/2010 Wort ................ C30B 23/02
117/200

* cited by examiner

*Primary Examiner* — David Vu
(74) *Attorney, Agent, or Firm* — Patent Office of Dr. Chung Park

(57) ABSTRACT

Disclosed is a semiconductor device structure including a III-V compound semiconductor material layer, a polycrystalline CVD diamond material layer, and an interface region, having a diamond nucleation layer, between the III-V compound semiconductor material layer and the polycrystalline CVD diamond material layer. A Raman signal generated from a region having the diamond nucleation layer exhibits an sp3 carbon peak at 1332 $cm^{-1}$ having a full width half-maximum of no more than 5.0 $cm^{-1}$. The Raman signal further exhibits one or both of the following characteristics: (i) an sp2 carbon peak at 1550 $cm^{-1}$ having a height no more than 20% of a height of the sp3 carbon peak; and (ii) the sp3 carbon peak at 1332 $cm^{-1}$ is no less than 10% of local background intensity. The diamond nucleation layer further includes an average nucleation density range of $1\times10^8$ $cm^{-2}$ to $1\times10^{12}$ $cm^{-2}$.

9 Claims, 7 Drawing Sheets

Related U.S. Application Data

(60) Provisional application No. 61/872,803, filed on Sep. 2, 2013.

(51) Int. Cl.
    *C23C 16/02*     (2006.01)
    *C23C 16/27*     (2006.01)
    *H01L 29/20*     (2006.01)
    *H01L 21/311*     (2006.01)

(52) U.S. Cl.
    CPC .... *H01L 21/31111* (2013.01); *H01L 23/3732* (2013.01); *H01L 29/2003* (2013.01); *H01L 2924/0002* (2013.01)

SEMICONDUCTOR DEVICE STRUCTURES COMPRISING POLYCRYSTALLINE CVD DIAMOND WITH IMPROVED NEAR-SUBSTRATE THERMAL CONDUCTIVITY

CROSS REFERENCE TO RELATED APPLICATIONS

This application is a divisional application of application Ser. No. 14/909,791, entitled "Semiconductor device structures comprising polycrystalline CVD diamond with improved near-substrate thermal conductivity," filed on Feb. 3, 2016, which is a national stage application of PCT international patent application No. PCT/US2014/053544, filed on Aug. 29, 2014, which claims the benefit of U.S. Provisional Application No. 61/872,803, filed on Sep. 2, 2013.

FIELD OF THE INVENTION

The present invention relates to methods for depositing polycrystalline diamond using chemical-vapor deposition (CVD) on non-diamond substrates with very low near-substrate thermal boundary resistance and semiconductor device structures fabricated using such methods. The invention particularly relates to methods for growing CVD diamond with high thermal conductivity during the initial diamond growth phases. The primary application of this invention is thermal management of high-power electronic and optoelectronic devices.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic device while maximizing performance (power and speed) and reliability. Examples of such devices are microwave transistors, light-emitting diodes and semiconductor lasers. Depending on the frequency of operation and power requirements, these devices have been conventionally made on silicon, gallium arsenide (GaAs), indium phosphide (InP), and in recent years gallium nitride (GaN), aluminum nitride (AlN) and other wide-gap semiconductors. Gallium nitride material systems give rise to microwave transistors with high-electron mobility (necessary for high-speed operation), high breakdown voltage (necessary for high power), and thermal conductivity that is greater than GaAs, InP, or silicon, and thus suitable for use in high power applications. GaN is also used in manufacturing of blue and ultraviolet lasers and light-emitting diodes. In spite of the high-temperature performance, GaN electronic and optoelectronic devices are limited in performance due to relatively low thermal resistance of the substrates commonly used for growth of GaN. This deficiency is most pronounced in high-power microwave and millimeter-wave transistors and amplifiers where reduced cooling requirements and longer device life, both benefiting from lower junction temperature, are in critical demand. Similar need is exhibited in high-power blue and ultraviolet lasers where a several-micrometer-wide laser cavity stripe dissipates power into the chip though low thermal conductivity materials.

It is well known that diamond is the most thermally conductive substance known to man. For this reason, the semiconductor industry has been employing diamond heat-sinks and heat spreaders for improved thermal management since the commercialization of synthetic diamond by chemical-vapor deposition in the 1980s. The objective of optimal heat management is to bring the diamond heat-spreader or diamond layers into close proximity of the heat source in the electronic or optoelectronic devices. This means building devices on thin chips and mounted on diamond heat-spreaders, coating devices with diamond layers, or transferring device epilayers onto diamond.

GaN-on-diamond technology and resulting devices (described in U.S. Pat. No. 7,595,507) involve structures which feature atomically attached GaN epilayers to diamond substrates. This technology enables bringing together the best heat conductor (diamond) together with electronic and optoelectronic devices based on gallium-nitride (GaN) and GaN-related compounds. Due to GaN's inherent high critical electrical field and wide bandgap, GaN devices are preferred for high power electrical and optoelectronic applications, such as, high power RF transistors and amplifiers, power management devices (Schottky diodes and switching transistors), as well as, high power blue and ultraviolet lasers or light-emitting diodes.

GaN is presently grown on several different substrates: sapphire, silicon, silicon carbide, aluminum nitride, single-crystal diamond, and GaN substrates. With the exception of GaN substrates, all other materials have lattice constants that differ from that of GaN and AlGaN. Natural diamond is an excellent thermal conductor, but has not been available for these applications due to scarcity and price. Presently, synthetic diamond is being manufactured with various degrees of crystallinity. Polycrystalline diamond deposited by chemical-vapor deposition (CVD) is suitable for use in the semiconductor industry as its thermal conductivity is close to that of single crystal diamond, while it still remains isolating, has low dielectric losses, and can be made transparent. CVD diamond substrates for semiconductor industry can be formed as round wafers with standard diameters. Diamond wafers are manufactured by chemical vapor deposition by one of three main methods: plasma enhanced diamond CVD where the energy to dissociate the reactants comes from a microwave source, thermally assisted diamond CVD where the energy for dissociating gasses comes from a hot filament, and plasma torch where ions are accelerated using a high DC voltage. In these processes, synthetic diamond is grown on top of non-diamond substrates, such as, silicon, silicon nitride, silicon carbide and different metals.

The CVD diamond growth process is carried out in a vacuum chamber within which a substrate is provided on top of which diamond is to be grown. The substrate is exposed to the energy source needed to dissociate molecules of precursor gases needed to form diamond on the surface of the substrate. The precursor gases needed in the chemical vapor deposition of diamond are a source of carbon diluted in hydrogen ($H_2$). Typical carbon-carrying gases are methane ($CH_4$), ethane ($C_2H_6$), carbon monoxide (CO), and acetylene ($C_2H_2$), with methane ($CH_4$) being the most commonly used. The gas combination needed for efficient diamond deposition contains a small (several percent) composition of the carbon-carrying gas in hydrogen, and the reaction can be further assisted with addition of oxygen or oxygen precursors such as CO or $CO_2$. A most common parameter specifying the gas-flow recipe is given in terms of the molar ratio of carbon carrying gas flow and hydrogen gas flow. For example, in terms of percentage $[CH_4]/[H_2]$ where $[CH_4]$ and $[H_2]$ are molar flow rates typically measured in standard cubic centimeters per minute (sccm). Typical substrate temperatures during the deposition process are between 550° C. and 1200° C., and deposition rates are usually measured in micrometers (μm) per hour.

Growth of synthetic diamond on non-diamond substrates includes a surface preparation phase and nucleation phase in which conditions are adjusted to enhance the growth of diamond crystals on the host (non-diamond) substrate. This is most commonly done by scratching or "seeding" the surface with diamond powder in a controlled and repeatable manner. During the growth phase, the grain size of synthetic diamond increases and as a result synthetic diamond films are inherently rough after deposition. The nucleation of diamond generally starts with very small diamond domains embedded in non-diamond matrix which has poor thermal conductivity in the near-substrate regions.

There is a need in the industry to improve the thermal performance of electronic and optoelectronic devices that are integrated with synthetic diamond. The near-substrate thermal boundary resistance inherent to synthetic diamond growth is the final limitation to harnessing the high thermal conductivity of synthetic diamond for electronic and optoelectronic applications. The objective of embodiments of the present invention is thus to provide manufacturing processes that produce a diamond heat spreader directly attached to the active layers of electronic/optoelectronic devices with low near-substrate thermal boundary resistance. This specification describes methods for minimizing and optimizing thermal boundary resistance between epilayers of a semiconductor device and a bulk diamond substrate and semiconductor device structures fabricated using such methods to meet this objective. Embodiments relate to methods which involve growing polycrystalline CVD diamond material on a substrate comprising one or more semiconductor layers and particularly to wide band gap compound semiconductors, more particularly III-V semiconductors such as GaN.

SUMMARY OF THE INVENTION

Usually, the thermal conductivity of early stage nucleation diamond material is much lower than latter stage growth of polycrystalline CVD diamond material with micron scale inter-grown diamond grains. For this reason, when fabricating free standing wafers of polycrystalline CVD diamond material with micron scale inter-grown diamond grains for thermal heat spreading applications, the early stage nucleation diamond material is usually removed by surface processing after growth. For example, a polycrystalline CVD diamond layer may be grown on a silicon, silicon carbide, or refractory metal substrate, removed from the substrate, and then surface processed, e.g. by lapping and/or polishing, to remove surface material and particularly to remove early stage diamond nucleation material which has a high sp2 carbon content and a low thermal conductivity compared with the remaining diamond material.

However, this is not possible when the diamond material is integrated into compound semiconductor device structures by growing the diamond material directly on a substrate comprising compound semiconductor layers. In such fabrication processes, the diamond is grown onto a structured compound semiconductor substrate so as to be an integral layer of the substrate which is subsequently processed into semiconductor device components comprising the diamond layer. As the diamond layer is not removed from the compound semiconductor substrate, the nucleation diamond material is retained in the semiconductor device components.

Furthermore, the early stage nucleation diamond material in such integrated structures is disposed proximate to the semiconductor layers over which the diamond layer was grown and therefore inhibits heat flow from the semiconductor layers into the better quality polycrystalline CVD diamond material with micron scale inter-grown diamond grains disposed distal to the semiconductor layers. Accordingly, the quality and thickness of the early stage nucleation diamond layer becomes critical to thermal performance of such semiconductor device structures. In this regard, embodiments of the present invention provide a route to improving the quality of the near substrate diamond material in semiconductor device structures while reducing the thickness of the diamond nucleation layer and thus improve thermal performance to a level required for certain commercial applications.

A number of parameters of a polycrystalline CVD diamond/non-diamond semiconductor substrate interface region have been identified which contribute to a thermal boundary resistance which is too high for many commercial applications. These parameters include:

(i) formation of voids at the interface between the non-diamond semiconductor substrate and the polycrystalline CVD diamond during the initial stages of polycrystalline CVD diamond growth on the non-diamond semiconductor substrate which reduce the thermal conductivity across the interface region between the non-diamond semiconductor substrate and the polycrystalline CVD diamond layer disposed thereon;

(ii) formation of non-diamond carbon phases during the initial stages of polycrystalline CVD diamond growth on the non-diamond semiconductor substrate which reduce the thermal conductivity across the interface region between the non-diamond semiconductor substrate and the polycrystalline CVD diamond layer disposed thereon;

(iii) formation of small grains of polycrystalline CVD diamond during the initial stages of polycrystalline CVD diamond growth with a large number of low quality grain boundaries which reduce the thermal conductivity and heat spreading across the interface region between the non-diamond semiconductor substrate and the polycrystalline CVD diamond layer disposed thereon; and (iv) formation of a relatively thick diamond nucleation layer of lower quality polycrystalline CVD diamond material (such as one having voids; significant quantities of non-diamond carbon; high dislocation density; extrinsic contaminants such as silicon, nitrogen and boron; and small grains with a large number of grain boundaries) prior to formation of higher quality polycrystalline CVD diamond material in the bulk of the polycrystalline CVD diamond layer.

It has been recognized that both nucleation of the non-diamond semiconductor substrate and early stage polycrystalline CVD diamond growth conditions can be modified in such a way as to reduce the formation of voids, reduce the proportion of non-diamond carbon phases and other defects (intrinsic and extrinsic, point like and extended), increase the size of the diamond grains which form during the early stages of polycrystalline CVD diamond growth, and reduce the thickness of the early growth stage, low quality nucleation diamond material. Several seeding and early stage polycrystalline CVD diamond growth techniques have been developed which can be used to fabricate semiconductor device structures by growing diamond films on top of non-diamond substrates in which the near-substrate thermal boundary resistance is minimized relative to conventional nucleation and diamond growth techniques.

In accordance with a first aspect of the present invention there is provided a semiconductor device structure comprising:
(i) a layer of semiconductor material;
(ii) a layer of polycrystalline CVD diamond material; and
(iii) an interface region between the layer of semiconductor material and the layer of polycrystalline CVD diamond material, the interface region including a diamond nucleation layer of polycrystalline CVD diamond which is formed during an initial nucleation phase of polycrystalline CVD diamond growth over a substrate comprising the layer of semiconductor material,
(iv) wherein the diamond nucleation layer is such that a Raman signal generated by a laser focused on a region comprising the diamond nucleation layer exhibits an sp3 carbon peak at 1332 $cm^{-1}$ having a full width half-maximum of no more than 5.0 $cm^{-1}$,
(v) wherein the diamond nucleation layer is such that said Raman signal further exhibits one or both of the following characteristics:
an sp2 carbon peak at 1550 $cm^{-1}$ having a height which is no more than 20% of a height of the sp3 carbon peak at 1332 $cm^{-1}$ after background subtraction when using a Raman excitation source at 633 nm; and
the sp3 carbon peak at 1332 $cm^{-1}$ is no less than 10% of local background intensity in a Raman spectrum using a Raman excitation source at 785 nm, and
(i) wherein an average nucleation density at a nucleation surface of the diamond nucleation layer is no less than $1 \times 10^8$ $cm^2$ and no more than $1 \times 10^{12}$ $cm^{-2}$.

The Raman signal parameters as defined above are indicative of good quality polycrystalline CVD diamond material which has a low sp2 carbon content within the diamond nucleation layer. While such Raman signal parameters have previously been achieved in the bulk of thick polycrystalline CVD diamond material, it is more difficult to achieve such parameters in an early growth stage diamond nucleation layer on wide band gap semiconductor substrates. As described in more detail later in this specification, embodiments of the present invention are able to achieve good quality polycrystalline CVD diamond material in the early stages of growth. This is advantageous when growing polycrystalline CVD diamond films on substrates containing wide band gap compound semiconductor layers for heat spreading applications in semiconductor device structures. As previously described, this is because when using diamond overgrowth techniques the early growth stage diamond material will be located proximate to the semiconductor material in the substrate and thus will be proximate to the heat source in end device applications. As such, it is desirable to ensure that the early growth stage diamond material in such configurations has good thermal conductivity.

In addition to the above, it has been found to be advantageous to provide an average nucleation density at a nucleation surface of the diamond nucleation layer which is no less than $1 \times 10^8$ $cm^{-2}$ and no more than $1 \times 10^{12}$ $cm^{-2}$. The nucleation density should be sufficiently low to ensure reasonably large grains with limited phonon scattering at grain boundaries and high thermal conductivity. Conversely, the nucleation density should be sufficiently high to ensure good diamond film formation with substantially no voids.

In accordance with a second aspect of the present invention there is provided a method of fabricating a semiconductor device structure as defined above, the method comprising:
(i) providing a substrate comprising a layer of semiconductor material;
(ii) seeding a surface of said substrate;
(iii) growing a diamond nucleation layer on said surface using a chemical vapour deposition (CVD) technique; and
(iv) growing a thicker layer of polycrystalline CVD diamond material over the diamond nucleation layer,
(v) wherein the method further comprises applying at least one of the following techniques:
using a nanocrystalline diamond powder for the seeding step, the nanocrystalline diamond powder having an average particle size of no more than 200 nm and a D90 particle size of no more than 500 nm thereby reducing the size of grooves formed in the substrate surface and consequently reducing void formation during diamond growth thereon when compared with a seeding process which utilizes larger seed particles;
using alternating CVD diamond growth and non-diamond carbon etch steps to fabricate the diamond nucleation layer, the technique comprising growing a diamond layer of a first thickness by chemical vapor deposition, etching at least a part of said diamond layer, repeating said steps of growing and etching at least a part of said diamond layer until an overall thickness of said diamond layer reaches a second thickness, wherein said step of etching at least a part of said diamond layer etches non-diamond phases preferentially over diamond phases thereby increasing the proportion of diamond phase in the diamond nucleation layer relative to non-diamond phases;
using a pre-growth etching step applied to the substrate surface after seeding and prior to growth of the diamond nucleation layer thereon, wherein crystalline seeds are deposited on the substrate surface during seeding and the pre-growth etching step comprises etching using a chemistry which is selected to etch the substrate surface preferentially over crystalline seeds on the substrate surface and to smooth the substrate surface thereby reducing nucleation sites formed by sharp groove edges on the substrate surface relative to nucleation sites provided by the crystalline seeds.

The aforementioned techniques involve: increasing nucleation densities and reducing grooves in the substrate using fine nanoparticle seeding to reduce void formation and non-diamond carbon phases; using an alternating growth and etching procedure during early stage growth to reduce non-diamond carbon and increase grain size; and using a pre-growth etch selected to reduce nucleation on the substrate surface relative to the seeds to increase crystal domains and consequently diamond grain size during early stage growth. Advantageously these techniques can be used in combination with either two or all three techniques being applied together. For example, while a nanocrystalline powder can increase nucleation densities, reduce void formation and non-diamond carbon, and thus increasing thermal conductivity, if the nucleation density is too high then the crystal domain size can be reduced resulting in more grain boundaries which will reduce thermal conductivity. As such, techniques (a) and (c) may be applied in combination to allow a high but controlled nucleation to be provided allowing optimization of nucleation density versus crystal domain size while also lowering void formation, non-diamond carbon, and other defects. Technique (b) may then be used to further reduce the amount of non-diamond carbon during the early stages of polycrystalline CVD diamond growth and reduce the thickness of the nucleation layer before moving into a higher quality bulk polycrystalline CVD diamond growth phase.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF THE INVENTION

Figure 1:
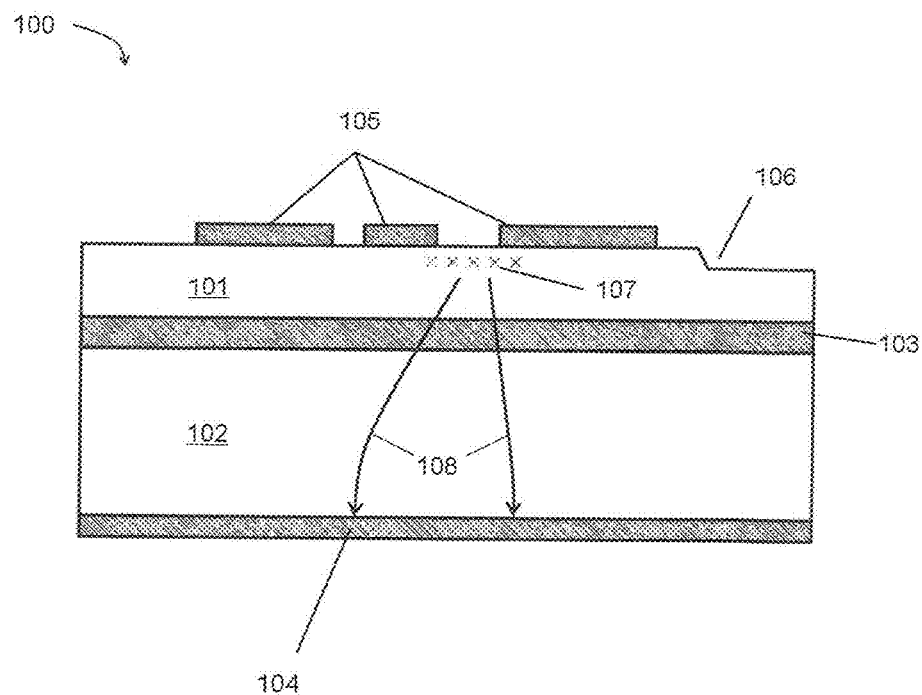
FIG. 1 shows a high-electron mobility transistor epilayer structure illustrating the heat flow and the obstacles to heat flow.

A number of measurement techniques have been found to be useful in characterizing early growth stage diamond material including Raman spectroscopy, scanning electron microscopy (SEM), and transmission electron microscopy (TEM). These techniques have been found to be useful in analyzing the crystal quality of early growth stage diamond material, sp2 carbon content, thickness of the early growth stage diamond material, and the presence of voids. By analyzing the early growth stage diamond material using these techniques and then adapting seeding, etching, and CVD growth techniques in the early stages of CVD diamond growth it has been found to be possible to provide better quality early growth stage diamond material and thus improve the thermal properties of such material in semiconductor device structures.

Raman spectroscopy has been found to be a particularly useful technique for measuring sp2 carbon content in localized regions. Raman spectroscopy will typically use a 500 nm-1000 nm light wavelength which, when focused on a surface of diamond, will sample a surface volume of approximately 1 µm$^3$. Non-diamond carbon peaks include: 1580 cm$^{-1}$—graphite; 1350-1580 cm$^{-1}$—nanocrystallite graphite; and 1550-1500 cm$^{-1}$—amorphous carbon and graphitic phases. It has been found that if non-sp3 bonded carbon is evident to any significant extent in a Raman spectrum of a synthetic diamond material then the material will have poorer thermal characteristics. Accordingly, preferably the sp2 carbon content is sufficiently low as to not exhibit any significant non-diamond carbon peaks in a Raman spectrum of the material.

The sp3 diamond Raman peak resides at approximately 1332 cm$^{-1}$. The width of the sp3 diamond Raman peak is known to be indicative of the crystal quality of the diamond material. According to certain embodiments, a Raman signal generated by a laser focused on a region comprising the diamond nucleation layer exhibits an sp$^3$ carbon peak at 1332 cm$^{-1}$ having a full width half-maximum of no more than 5.0 cm$^{-1}$, 4.0 cm$^{-1}$, 3.0 cm$^{-1}$, 2.5 cm$^{-1}$, or 2.0 cm$^{-1}$. While such Raman signal parameters have previously been achieved in the bulk of thick polycrystalline CVD diamond material, embodiments of the present invention provide such parameters in an early growth stage diamond nucleation layer by using specific seeding and early stage growth techniques.

According to certain embodiments, using a helium-neon laser (633 nm) as the Raman excitation source focused on a region comprising the diamond nucleation layer produces a diamond Raman spectrum with an sp2 carbon peak at around 1550 cm$^{-1}$ which is no more than 20%, 10%, 5%, 1%, 0.1%, 0.01%, or 0.001% of the height of the sp3 diamond Raman peak residing at around 1332 cm$^{-1}$ after background subtraction. The amount of sp2 carbon may alternatively be assessed by measuring the height of the sp3 diamond Raman peak residing at approximately 1332 cm$^{-1}$ relative to the height of the local background to that peak which is due to impurities such as sp2 carbon. According to certain embodiments, using a Raman excitation source at 785 nm focused on a region comprising the diamond nucleation layer produces a diamond Raman spectrum with an sp$^3$ carbon peak at approximately 1332 cm$^{-1}$ which is no less than 10%, 20%, 30%, 40%, 50%, 60%, or 70% of the local background intensity in the Raman spectrum. Again, while such Raman signal parameters have previously been achieved in the bulk of thick polycrystalline CVD diamond material, embodiments of the present invention provide such parameters in an early growth stage diamond nucleation layer by using specific seeding and early stage growth techniques as described in more detail later in this specification.

In relation to the above, it should be noted that the sensitivity of Raman spectroscopy to the presence of sp2 carbon in diamond material is dependent on the excitation wavelength used to perform the Raman spectroscopy measurements. For example, Raman spectroscopy performed using a Raman excitation laser at 514 nm is relatively insensitive to sp2 carbon content in diamond material while excitation wavelengths of 633 nm and 785 nm are more sensitive to sp2 carbon content than 514 nm. As such, even if no sp2 carbon peak is present in a Raman spectrum at an excitation wavelength of 514 nm, this does not mean that a significant sp2 peak would not be present using an excitation source at 633 nm or 785 nm. This sensitivity effect is known to those skilled in the art.

In addition, it should also be noted that the low levels of sp2 carbon defined in the present specification are measured using a laser focused on the diamond nucleation layer. The low levels of sp2 carbon have previously been achieved in bulk polycrystalline CVD diamond material and in surface polycrystalline CVD diamond material which has been processed by, for example lapping and polishing, to remove early stage diamond nucleation material. What is new here is the ability to achieve such low levels of sp2 carbon in early stage diamond nucleation material which has not been removed prior to spectroscopic analysis and is present as an integral part of wide band gap compound semiconductor devices fabricated using a diamond overgrowth technique.

Nucleation density can be measured using scanning electron microscopy (SEM). This may be performed on a nucleation face of a diamond layer by removing the non-diamond material adhered to the nucleation surface of the diamond material and then SEM imaging the nucleation surface of the diamond material. SEM images of the nucleation surface indicate boundaries between grains. A mean grain size can be measured and this can be converted into a nucleation density. An alternative way of measuring nucleation density is to terminate a diamond growth run during its early nucleation stages (typically the first 0.5 to 5 hours of the run). Using SEM imaging it is then possible to count individual nuclei just before the diamond layer has fully coalesced.

It has been found that the nucleation density should be sufficiently low to ensure reasonably large grains with limited phonon scattering at grain boundaries and high thermal conductivity while being sufficiently high to ensure good diamond film formation with substantially no voids. As such, the average nucleation density at a nucleation surface of the diamond nucleation layer should be no less than $1\times10^8$ $cm^{-2}$ and no more than $1\times10^{12}$ $cm^{-2}$. For example, the average nucleation density at the nucleation surface of the diamond nucleation layer may be no less than $5\times10^8$ $cm^{-2}$, $1\times10^9$ $cm^{-2}$, $5\times10^9$ $cm^{-2}$, or $8\times10^9$ $cm^{-2}$. Furthermore, the average nucleation density at the nucleation surface of the diamond nucleation layer may be no more than $5\times10^{11}$ $cm^{-2}$, $1\times10^{11}$ $cm^{-2}$, $5\times10^{10}$ $cm^{-2}$, or $3\times10^{10}$ $cm^{-2}$.

Transmission electron microscopy (TEM) has also been found to be a useful technique for measuring the properties of early stage diamond growth. In cross-sectional TEM images the nucleation layer appears as a distinctive dark grainy layer while voids appear as light/white and well defined regions. The voids are brighter in contrast to the surrounding material and can be seen to have a clear boundary with the surrounding material on a carefully analyzed high quality image. As such, it has been found that the diamond nucleation layer thickness, volume fraction of voids, and void thickness can be measure using TEM.

Using TEM imaging to characterize diamond nucleation layer thickness and void content it has been found to be possible to adapt seeding and early stage CVD etching and growth techniques in order to provide an interface region which has a thin, substantially void-free diamond nucleation region. For example, one or more of the following characteristics can be provided:

(i) the diamond nucleation layer may have a mean thickness as measured using transmission electron microscopy imaging of no more than 50 nm, 45 nm, 35 nm, 25 nm, or 20 nm;
(ii) the diamond nucleation layer may have a volume fraction of voids as measured using transmission electron microscopy imaging of no more than 10%, 8%, 6%, or 4% in a representative sample comprising an area of at least 200 nm×100 nm;
(iii) the diamond nucleation layer may have no voids having a thickness greater than 20 nm, 15 nm, 10 nm, or 5 nm in a representative sample comprising an area of at least 200 nm×100 nm;
(iv) the diamond nucleation layer may have no visible voids discernible in transmission electron microscopy imaging in a representative sample comprising an area of at least 200 nm×100 nm.

The semiconductor device structures as defined above comprise a diamond nucleation layer which is substantially free of voids, which has a low proportion of non-diamond phases, which has large diamond grain sizes at an early stage of diamond growth, and which has a relatively thin nucleation layer prior to moving into higher quality bulk polycrystalline CVD diamond material such that the thermal boundary resistance between the semiconductor substrate and the polycrystalline CVD diamond material is low.

Using the techniques as described herein the thermal boundary resistance may be no more than 50 $m^2K/GW$, 35 $m^2K/GW$, 30 $m^2K/GW$, 25 $m^2K/GW$, 20 $m^2K/GW$, 15 $m^2K/GW$, or 10 $m^2K/GW$. This may be achieved, for example, by increasing the intrinsic diamond quality (lower defects), lowering the proportion of voids and non-diamond carbon in early stage growth while decreasing the overall thickness of the diamond nucleation layer and increasing the grain size during early stage diamond growth.

A thick layer of good quality diamond material can be grown over the nucleation layer. The layer of polycrystalline CVD diamond material may have a thickness of at least 5 micrometers, 10 micrometers, 20 micrometers, 30 micrometers, 50 micrometers, 80 micrometers, 100 micrometers, 150 micrometers, 200 micrometers, or 250 micrometers.

It is envisaged that embodiments of the present invention will be applied when growing polycrystalline CVD diamond over substrates comprising a gallium nitride semiconductor layer, although embodiments may utilize other semiconductor materials. For examples, the substrate on which the polycrystalline CVD diamond is grown may comprise one or more layers fabricated from silicon, gallium arsenide (GaAs), indium phosphide (InP), aluminum nitride (AlN), aluminium gallium nitride (AlGaN), or other wide-gap semiconductors. In addition, the interface region may further comprise one or more adhesion layers disposed between the diamond nucleation layer and the layer of semiconductor material. For example, an adhesion layer formed of silicon nitride, silicon dioxide, silicon carbide or aluminium nitride may be used and this is particularly preferred in combination with the use of a gallium nitride semiconductor structure. Preferably the adhesion layer has a thickness of no more than 200 nm, 100 nm, 50 nm, 40 nm, 35 nm, or 30 nm. Such a thin adhesion layer provides a lower thermal boundary resistance between the semiconductor material and the diamond material.

In accordance with another aspect of the present invention there is provided a method of fabricating a semiconductor device structure as defined above, the method comprising:
(i) providing a substrate comprising a layer of semiconductor material;

(ii) seeding a surface of said substrate;
(iii) growing a diamond nucleation layer on said surface using a chemical vapour deposition technique; and
(iv) growing a thicker layer of polycrystalline CVD diamond material over the diamond nucleation layer,
(v) wherein the method further comprises applying at least one of the following techniques:

using a nanocrystalline diamond powder for the seeding step, the nanocrystalline diamond powder having an average particle size of no more than 200 nm and a D90 particle size of no more than 500 nm thereby reducing the size of grooves formed in the substrate surface and consequently reducing void formation during diamond growth thereon when compared with a seeding process which utilizes larger seed particles;

using alternating CVD diamond growth and non-diamond carbon etch steps to fabricate the diamond nucleation layer, the technique comprising growing a diamond layer of a first thickness by chemical vapor deposition, etching at least a part of said diamond layer, repeating said steps of growing and etching at least a part of said diamond layer until an overall thickness of said diamond layer reaches a second thickness, wherein said step of etching at least a part of said diamond layer etches non-diamond phases preferentially over diamond phases thereby increasing the proportion of diamond phase in the diamond nucleation layer relative to non-diamond phases;

using a pre-growth etching step applied to the substrate surface after seeding and prior to growth of the diamond nucleation layer thereon, wherein crystalline seeds are deposited on the substrate surface during seeding and the pre-growth etching step comprises etching using a chemistry which is selected to etch the substrate surface preferentially over crystalline seeds on the substrate surface and to smooth the substrate surface thereby reducing nucleation sites formed by sharp groove edges on the substrate surface relative to nucleation sites provided by the crystalline seeds.

When applying technique (a), the average particle size of the seeding powder may be no more than 200 nm, 150 nm, 100 nm, 80 nm, 60 nm, 40 nm, 20 nm, or 10 nm. While in principle one may envisage that the nanocrystalline diamond seeding powder may be selected to be as fine as possible, in practice it has been found that if the powder is too fine then reproducible, uniform, high density seeding is not achieved. As such, the average particle size of the nanocrystalline diamond powder used in the seeding step may be no less than 3 nm, 5 nm, or 6 nm. That is, it has been found that a range of seed powder size between the aforementioned upper and lower bounds is optimum for seeding in accordance with certain embodiments of the present invention. Furthermore, while the seeding powder may be applied to the surface of the substrate in dry form, according to certain embodiments of the present invention the nanocrystalline diamond powder is suspended in a colloidal suspension for the seeding step.

In relation to the above, it may be noted that typically particles will be irregular in shape and non-spherical, in this case (and for the purposes of this specification) the above-mentioned quantitative definition of particle size has to be extended to non-spherical particles. The definition used herein is based on replacing a given particle with an imaginary sphere that has a volume identical with the original particle, which means that one can use the diameter of the imaginary sphere that has same volume as a given particle as a measure of particle size. Furthermore, in a collection of very small particles, it is common that the particle size is a random variable defined with a specific size distribution.

The "particle size" in such a collection or colloidal suspension is then an average particle size found in this distribution. This is also termed the D50 value, by sample volume, and can be measured using a system such as a Malvern Instruments Mastersizer S. This type of analysis will also commonly give a D90 value, which corresponds to the size of particle below which 90% of the volume of particles is contained. It is also important that the largest size particles are relatively small, to avoid damage caused by larger scratches in the seeded non-diamond surface on which the diamond nucleates. This D90 size may be smaller than 500 nm, 400 nm, 300 nm, 250 nm, 200 nm, 175 nm, or 100 nm.

When applying technique (b), an initial diamond layer thickness between 10 and 50 nm may be grown prior to application of an etch step. Growth and etching steps may be repeated until a final growth thickness of at least 50 nm is reached. After this alternating growth and etch stage, a continuous diamond growth stage may be applied to grow a thicker layer of bulk polycrystalline CVD diamond material with micron scale inter-grown diamond grains.

When applying technique (c), the pre-growth etching step may etch the substrate surface by no more than 10 nm. In this regard, the pre-growth etch is only intended to round off sharp edges formed by scratching of the substrate surface during seeding. If the etch is too aggressive then it may overly reduce the nucleation density by etching away seed crystals and/or begin to preferentially etch defects in the surface of the substrate.

In addition to the above, it can also be advantageous during early stage diamond growth to provide an increase in carbon carrying gas concentration and/or an increase in power and/or an increase in pressure. For example, providing a low level of carbon carrying gas in the CVD atmosphere during early stage growth can reduce non-diamond carbon formation during early stage growth, particularly when combined with the above described nanopowder seeding, pre-growth etch, and early stage alternating growth and etch techniques.

FIG. 1 illustrates an exemplary electronic or optoelectronic device 100 comprising of active epilayers 101 disposed on top of a CVD diamond substrate 102 with an optional intermediate adhesion layer 103. The epilayers 101 generally comprise more than one layer of different semiconductor material. The formed device 100 generally features at least one electrical contact 105 on its surface and may optionally include parts of the surface etched away to form isolating regions as indicated with 106. Gallium nitride and related (lattice matched) compounds (AlGaN, InGaN, etc) may be used in the epilayers 101 to form high-electron mobility transistors, semiconductor lasers, super-luminescent diodes, or light-emitting diodes. Owing to its high thermal conductivity, the diamond substrate 102 serves as a heat spreader for heat originating in the active layer 101 of device 100. Heat is generated in the regions schematically illustrated with 'xxxx' in 107. The flow of heat is illustrated schematically with arrows 108 as it flows from the heat source 107 across the adhesion layers 103 and through the diamond substrate 102 to the back of the chip over a metal interface 104 to the heat sink below the chip (not shown). The thermal resistance of the device 100 is determined by thermal properties of the layers and interfaces that the heat generated in 107 has to traverse as it flows from the heat source 107 to the back of the chip 104. In order to achieve minimum thermal resistance, all the materials involved (epilayers 101, the substrate 102, and the adhesion layer 103) and thermal resistance of the boundaries between each of these layers should be minimized. This quantity includes the bulk resistance of the adhesion layer 103 and the thermal boundary resistance between the epilayers 101 and the adhesion layer 103, the thermal boundary resistance of the interface between the adhesion layer and the diamond substrate, and any low-thermal conductivity regions in the top most layers of diamond. Inasmuch as the adhesion layer thickness can be controlled and minimized (thickness ranges between 10 and 50 nanometers), one is left with having to minimize the thermal boundary resistance between the GaN epilayers 101 to diamond substrate 102, which includes the near-substrate thermal boundary resistance.

One of the processes for integrating gallium nitride and CVD diamond is described in U.S. Pat. No. 7,595,507. In U.S. Pat. No. 7,595,507 CVD diamond layers are grown on a substrate covered with a dielectric adhesion layer. Using the method described in U.S. Pat. No. 7,595,507, one can form the exemplary diamond substrate 102 below the adhesion layer 103 and the epilayers 101 of device 100 shown in FIG. 1. In an alternative process, the diamond substrate 102 may be formed independently and attached to the adhesion layer 103 and the epilayers 101. In either one of these cases, the diamond substrate 102 is obtained by CVD growth by any of the known methods known in the art. In yet another alternative process, diamond films are deposited on top of completed devices to assist in heat spreading. In either case, the near-substrate thermal boundary resistance plays a direct role in determining the device thermal resistance and should be minimized. In this application, near-substrate means close to the surface on top of which diamond is nucleated and grown.

CVD diamond may be grown monocrystalline, but it is generally grown polycrystalline with the size of the crystals (or domains) changing with thickness of diamond grown and with process conditions. The surface on top of which diamond is to be grown has to exhibit suitable chemical properties and has to be prepared to enable the efficient nucleation of diamond crystals and subsequent growth. Typical materials on top of which CVD diamond may be grown include but are not limited to silicon, silicon nitride, aluminum nitride, silicon carbide, refractory metal carbides, refractory metals or diamond. The quality of diamond, for example, the size and rate of domain growth and the amount of non-diamond inclusions depends on the growth conditions and the time of growth. It is well known that the size of the diamond domains increases with the time of growth and that this has a profound effect on the thermal conductivity of the grown diamond films as can be seen in published work by J. E. Graebner et. al., entitled "Thermal conductivity and the microstructure of state-of-the-art chemical-vapor-deposited (CVD) diamond", published in Diamond and Related Materials, vol. 2, p. 1059 (1993).

The control of diamond nucleation and the early stages of diamond growth are essential for control of the diamond properties that are sensitive to, or directly depend on, the film anisotropy, grain size, and microscopic voids in the film. This phenomenon particularly affects the thermal conductivity of the films. Heterogeneous nucleation of diamond is a topic of intense research and intellectual property creation because it results in diamond layers and substrates grown on inexpensive substrates. Nucleation involves starting the growth of diamond on a non-diamond substrate such as silicon, refractory carbides, and other materials. These methods are of particular interest in the electronics industry where diamond substrates are often not the most economical choice. Hydrogen and its dissociation play a key role in diamond synthesis, but also in etching of non-diamond species during growth and terminating the diamond surface against reconstructing into graphitic phases. The details of diamond synthesis are available in public documents and publications. For example, this information can be found in *Diamond Films Handbook*, edited by J. Asmussen and D. K. Reinhard, published by Marcel Drekker, Inc., New York, 2002.

The nucleation of diamond films can be described with at least three stages: (1) an incubation period in which independent crystals are formed on the surface of the substrate; (2) cessation of the formation of new crystals and three-dimensional growth of individual crystals on the crystals that have formed during the first phase; and (3) faceting and merging of adjacent crystals into a continuous film in which diamond domains grow upward away from the substrate (columnar growth).

The relevant parameters characterizing the initial phase whose duration may last anywhere from minutes to many hours, are the nucleation density $N_D$, namely, the number of individually formed crystallites on the substrate surface (with typical number ranging from $\approx 10^5$ cm$^{-2}$ to $10^{12}$ cm$^{-2}$) and the nucleation rate $N_R$ (with typical numbers between $10^3$ and $10$ cm$^{-2}$ hr$^{-1}$).

It has been observed that on most materials without any additional preparation, the incubation phase, described above, produces relatively low nucleation densities ($N_D \approx 10^5$ cm$^{-2}$). In order to increase the nucleation density, a process referred to as seeding or scratching is generally implemented. Seeding is a pretreatment of the substrate surface in which a diamond powder with particle size between several nanometers (nanocrystalline diamond powder) to several hundred nanometers (diamond grit), in dry form or suspended in a liquid, is used to scratch the substrate surface. In liquid form, the seeding is typically done in an ultrasonic or megasonic bath. Seeding is the most widely used technique for enhancing diamond nucleation; it may be done using materials other than diamond (borides, carbides, nitrides, silicides, and graphite). Diamond nucleation densities after seeding may increase many orders of magnitude relative to un-treated surfaces: between $N_D$ $10^6$ cm$^{-2}$ and $10^{12}$ cm$^{-2}$. The seeding/scratching appears to work as a result of a combination of: (a) diamond seeding in which diamond particles brought in by the scratching remain attached to the surface and become the nucleating sites in subsequent growth; and (b) dangling bonds at sharp edges of the scratched surface and energetically favorable convex surfaces favor nucleation of diamond. For these reasons, the terms "diamond scratching" and "diamond seeding" are used interchangeably in the industry.

The process of diamond layer growth during a CVD growth process, and diamond crystal formation from the commencement of nucleation to stable domain growth, involves a complex set of chemical reactions in which growth of diamond and non-diamond inclusions compete. Diamond nucleation on untreated non-diamond substrates is generally very low. For example, on silicon the nucleation density is around $10^5$ cm$^{-2}$, whereas nucleation densities in excess of $10^{10}$ cm$^{-2}$ are desired. During seeding, diamond particles chip against the substrate material and may damage the top surface of the substrate and produce rough films. Another technique for enhancing diamond nucleation is seeding the substrate with nano-crystalline diamond (NCD) particles with effective diameter less than 150 nm, 100 nm, 80 nm, 60 nm, 40 nm, 20 nm, or 10 nm, provided the particle size distribution does not include large diamond crystals 100 to 200 nm in size which can cause void formation and result in a significant void fraction at the interface region.

Consequently, the quality and void fraction of the first-grown layers of CVD diamond is very dependent on the process conditions. They involve a variety of phases and crystal sizes from nano-crystalline to amorphous phase. The result is that the interface between the substrate on top of which the diamond layers are grown and the bulk of diamond exhibits a noticeable thermal boundary resistance.

Figure 2:
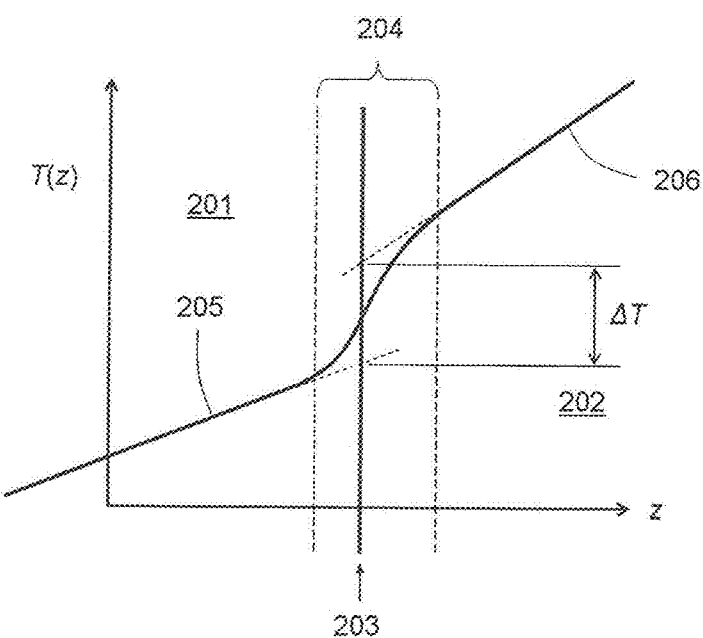
FIG. 2 illustrates the definition of thermal boundary resistances.

The concept of thermal boundary resistance (TBR) is a way of quantifying the temperature drop across an interface. It is a parameter that quantifies the resistance to heat flow in a direction perpendicular to an interface; it says nothing about the heat flow parallel to the interface. Real-life interfaces are never sharp; they involve gradual variation of thermal conductivity in a direction perpendicular to the junction which is most often unknown and can include voided regions. TBR is then used to quantify the net effect of such a real interface on heat flow perpendicular to the interface. The definition of this quantity is given with the help of FIG. 2 which shows an exemplary temperature profile T(z) across a metallurgical junction 203 between two bulk materials 201 and 202 as heat flows in the direction z perpendicular to the plane of the junction. If the heat flow were one-dimensional, namely, no heat flow parallel to the interface, then uniform but different thermal conductivities in materials 201 and 202 would give rise to linear variation in temperature in the two bulk materials with different slopes. This is illustrated with the linear segments 205 and 206 of the temperature profile in FIG. 2. Suppose that in a narrow region 204 around the metallurgical junction 203, the thermal conductivity varies gradually but not necessarily monotonically between the bulk values of the two materials. If the thermal conductivity exhibits a minimum in the region 204, the temperature profile T(z) exhibits a gradual variation as shown in FIG. 2. The effect of the gradual extended interface region with varying thermal conductivity on the temperature profile can be effectively described with an equivalent interface that exhibits a sudden increase in temperature $\Delta T$ and fully uniform thermal conductivities in the two bulk materials, i.e., the thermal conductivity has a discontinuity at 203 but is uniform to the right and the to left of the metallurgical junction 203. For the purposes of characterization and simulation, this equivalence works well as long as the width of the region 204 is such that heat flow parallel to the interface within region 204 is negligible relative to the rest of the heat flow in the structure. The dimensions in which TBR is expressed are area*temperature/power, and one of the more common units used in the semiconductor industry is $m^2K/GW$. TBR values may fall in a range of 10 to 100 $m^2K/GW$.

When diamond is grown on top of a substrate, the thermal boundary resistance across the interface between the substrate and the first-grown layers of diamond and across the gradually varying thermal conductivity region in the first several hundred nanometers of grown diamond is sizeable and presents a problem when heat is to be transferred across the interface region. This is particularly important in the structures and methods described in U.S. Pat. No. 7,595,507, where diamond layers are grown on top of adhesion layers. The TBR in this latter application is a sum of contributions from the adhesion layer, any potential voids and from the gradual thermal conductivity variation in the first-grown layers of diamond. The adhesion layer's contribution can be directly controlled by reducing the adhesion layer thickness, but the contribution from the void fraction and thermal conductivity of the first-grown layer are significantly more difficult and are the subject of this invention.

The theoretical foundations for an understanding of the origin of near-substrate diamond thermal boundary resistance is given in the work of M. N. Touzelbaev and K. E. Goodson titled "Impact of Nucleation Density on Thermal Resistance near Diamond-Substrate Boundaries", *Journal of Thermophysics and Heat Transfer*. In this work, the nucleation density and the rate of domain growth with diamond layer thickness were identified as key parameters to be controlled in order to achieve low near-substrate diamond TBR. The goal of reaching low TBR is a result of increasing the amount of crystalline diamond relative to graphite in the early stages of diamond growth, increasing the size of diamond crystal as fast as possible, and avoiding void formation during the early stages of diamond growth. No recipes or methods have been given in the industry on how to achieve this.

This specification discloses three methods for reducing near-substrate diamond thermal boundary resistance. Each of the three methods may be applied individually to achieve growth of a low near-substrate thermal resistance diamond layer, but methods may also be combined to benefit from each of the techniques. The selection of a particular method, or combination of methods, depends on the system and method of diamond growth. Furthermore, the conditions for practicing the disclosed methods are given in terms of ranges rather than exact numbers as diamond growth chambers differ in architecture and hence naturally require some fine tuning of process conditions to achieve the same material quality.

One approach to achieving low near-substrate diamond thermal boundary resistance or for manufacturing diamond layers with low near-substrate thermal boundary resistance is by growing diamond on a surface that has been prepared to give rise to very high nucleation density. High nucleation densities, above $10^{10}$ cm$^{-2}$ and as high as $10^{11}$ cm$^{-2}$, are reachable and may be required to achieve thermal boundary resistances below, for example, 10 $m^2K/GW$.

Examples of diamond grit sources which can successfully be used for this type of nucleation include natural diamond which has been crushed and sorted to obtain the appropriate grain size distribution; synthetic diamond which has been crushed and sorted to obtain the appropriate grain size distribution and detonation nanodiamond which has been chemically processed to remove its non-sp3 shell layers and sorted to obtain the appropriate grain size distribution.

A colloid is a two phase system consisting of a continuous phase (the dispersion medium) and dispersed phase (the particles or emulsion droplets). The particle size of the dispersed phase typically ranges from 1 nanometer to 1 micrometer. Examples of colloidal dispersions include solid/liquid (suspensions), liquid/liquid (emulsions), and gas/liquid (foams). A suspension of nano-crystalline diamond in water, ethanol or methanol is a colloidal suspension.

In one embodiment of the present invention, the substrate surface is seeded using nano-crystalline diamond (NCD) powder prior to diamond growth. The NCD powder with particle size range between 6 nm and 10 nm is dispersed into ethanol or methanol and the seeding is performed while the substrate is kept inside an ultrasonic or megasonic bath. The seeding is accomplished using a colloidal suspension of 50 grams of NCD for every 1 liter of liquid. Some choices for the liquid are deionized water, ethanol, isopropanol, acetone or methanol. With known particle size, one can estimate the maximum nucleation density possible by assuming some packing density on the surface. If the surface is covered with a single layer of NCD which is square close-packed, the nucleation density maximum is estimated to be $N_D \approx 1/d^2$.

Hence, seeding with NCD can result in nucleation densities exceeding $10^1$ cm$^{-2}$. This estimate is also documented in publications, such as, O. A. Williams, et al., titled "Enhanced diamond nucleation on monodispersed nanocrystalline diamond", in *Chemical Physics Letters, vol.* 445, p. 255 (2007). The seeding is followed by rinsing and drying the substrate and loading into a vacuum chamber where diamond growth is to be performed using any one of the known methods for CVD growth of diamond.

The conditions for initial phase of diamond growth on top of a substrate surface, such as that prepared as describe above, include stepwise increase in power and carbon gas composition. The pressure may be maintained fixed during the initial phases in the range between 2 and 30 Torr. The initial growth phase time may range between 15 min to 150 min depending on the total power delivered to the system. The operating power delivered to a CVD diamond growth system in normal growth phase on a 100 mm wafer is typically 2.5 to 7.5 kW in a hot filament system and typically 5 to 35 kW in a microwave plasma system. There values are only given as guidance and are not meant as limits or exact settings as diamond growth chambers differ in architecture and hence naturally require some fine tuning of process conditions. During the preferred initial phase of diamond growth on said prepared surface, the power delivered to the system is ramped slowly from zero (in a hot filament system) or the minimum plasma strike power (in a microwave plasma system) to the operating level over a system suitable period of time, while carbon carrying gas is ramped in at least one, but preferably more steps, to the operating flow rate. For example, if final percentage of carbon carrying gas in hydrogen is 4%, three steps in which the carbon carrying gas setting are 1%, 2%, and 3% may precede the operating setting of 4%.

Figure 6:
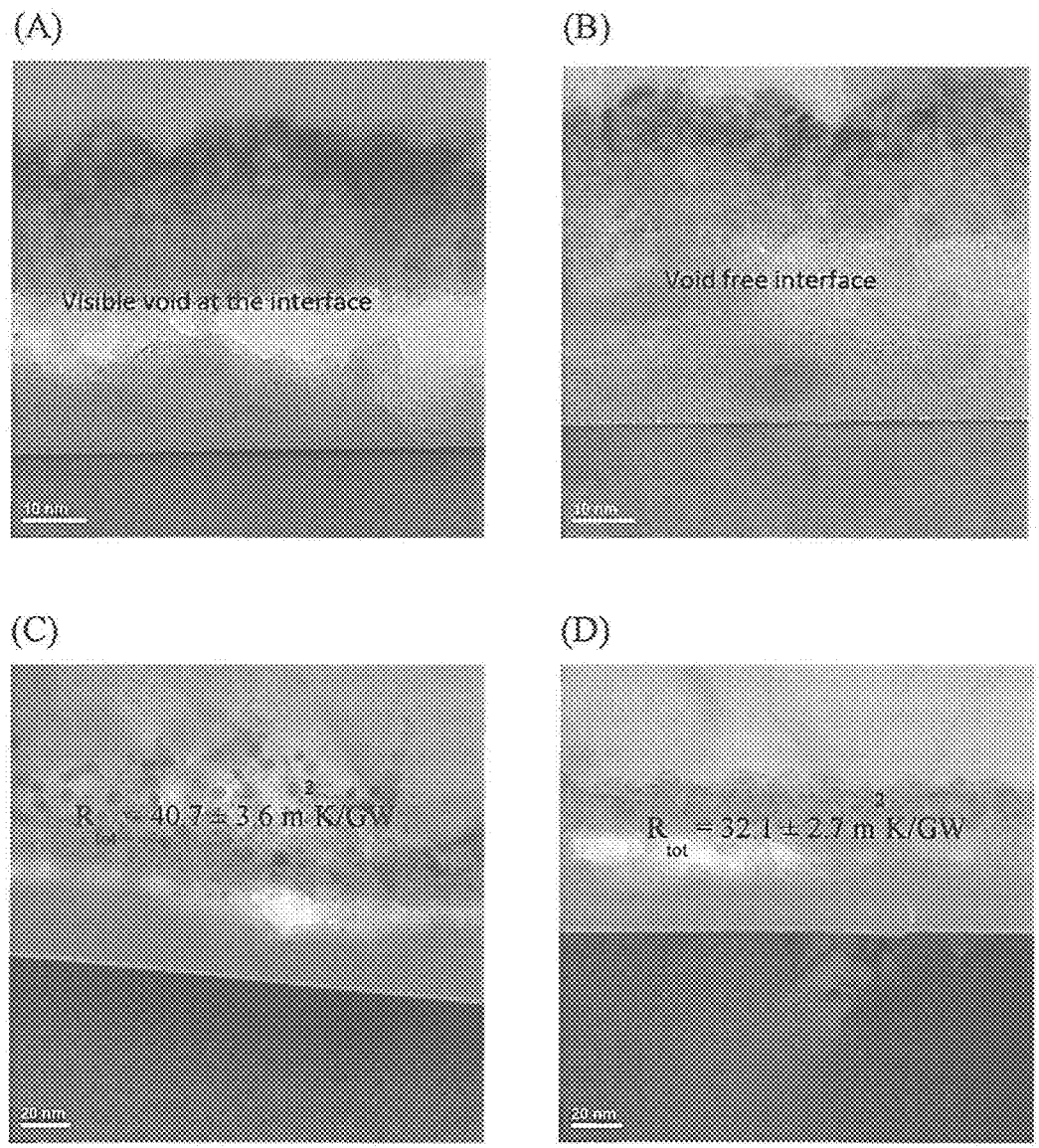
FIGS. 6(A) to 6(D) show Transmission Electron Micrographs (TEMs) of several diamond-substrate interfaces with FIG. 6(A) showing a substantial volume of voids formed using a conventional seeding and early stage diamond growth process, FIG. 6(b) showing a void free interface resulting from the application of a method as illustrated in FIG. 3, FIG. 6(c) showing a relative thick, low quality, high TBR diamond nucleation layer formed using a conventional early stage diamond growth process, and FIG. 6(d) showing a thinner, lower TBR nucleation layer formed using a method as illustrated in FIG. 4.

Additionally, NCD enhanced seeding results in formation of much finer grooves which are of the same order of depth as the early stage growth crystallites and thus greatly reduce void formation at the diamond growth interface. FIGS. 6(A) and 6(B) are Transmission Electron Micrographs (TEM) of two distinctly differently scratched/seeded growth interfaces. The substrate illustrated in FIG. 6(A) was scratched/seeded using 100-nm size microcrystalline diamond powder, whereas the substrate illustrated in FIG. 6(B) was scratched/seeded using 10-nm size NCD. In reviewing FIGS. 6(A) and 6(B), it is easy to see that the deeper grooves scratched in the substrate by 100-nm diamond powder are not fully filled resulting in a significant void fraction in comparison with a 10-nm diamond powder scratched surface. These voids necessarily have a low thermal conductivity. A resultant TBR of the order of 100 m$^2$K/GW can be calculated using a method for composite materials given in the book "Principles of Heat Transfer," by Frank Kreith, assuming 20-nm high voided areas each with a thermal conductivity of order 0.2 W/m·K.

Figure 3:
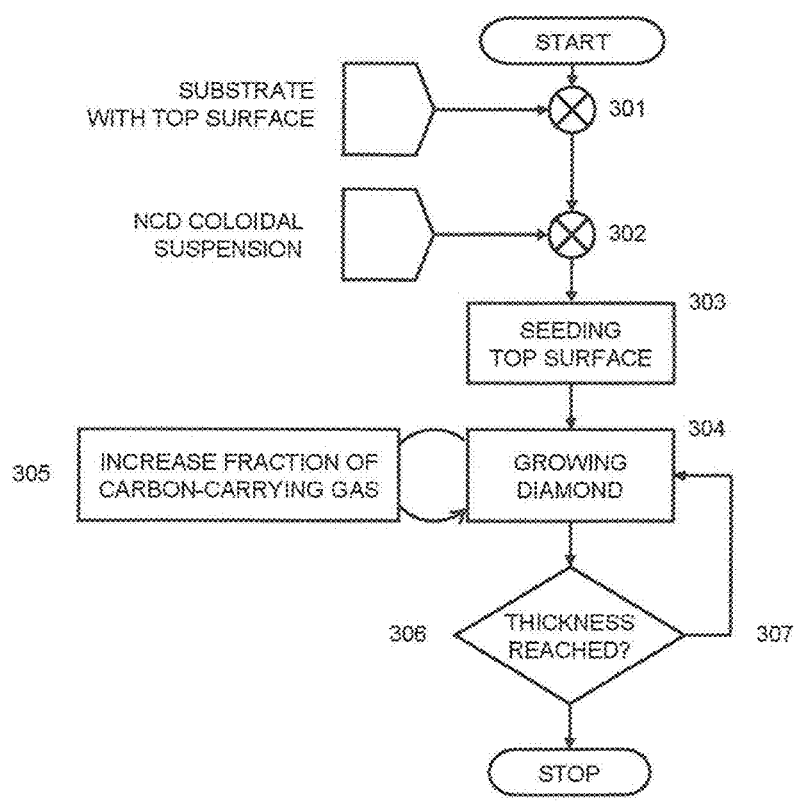
FIG. 3 shows a block diagram illustrating the steps of a first technique for improving near-substrate thermal boundary resistance including nanocrystalline diamond seeding and a ramped increase in carbon carrying gas during early stage diamond growth.

FIG. 3 illustrates a process block diagram for a method as described above. One embodiment of the method for manufacturing diamond layers with low near-substrate thermal boundary resistance comprises steps of providing a substrate with a top surface (301) and a colloidal suspension of nano-crystalline diamond (302), followed by seeding (303) the top surface with this colloidal suspension, and growing diamond (304). In one embodiment the top surface is silicon nitride, and in yet another embodiment the top surface is aluminum nitride. The growth of diamond (304) is performed by ramping the carbon-carrying gas in several steps (305) until the desired thickness is reached (306). The thickness limit (306) is defined by the desired thickness needed to complete the nucleation. The process of diamond growth continues once the nucleation phase disclosed in FIG. 3 has completed—past the "STOP" block. The pre-set thickness is not smaller than 10 nm.

Another embodiment of a method for achieving low near-substrate thermal boundary resistance employs increasing of the ratio between the densities of diamond phase relative to non-diamond phases in the near-substrate regions. This in turn leads to lower thermal boundary resistance. There have been reports in the published literature on diamond growth and layer characterization indicating that exposing diamond grown surfaces to hydrogen, preferentially etches non-diamond phases over diamond phases. An example of such report is given by N. Uchida, et al., titled "Hydrogen post-etching effect on CVD diamond film" published in the Journal of Materials Science Letters, vol. 9, p. 251, 1990. Most of the published reports demonstrate that the non-diamond phase content on the surface of a several micrometers or tens of micrometers thick diamond film may be altered by exposing the growth surface to hydrogen. This fact also reveals the role of hydrogen during active diamond growth: diamond growth results as a difference between the growth of combined diamond and non-diamond phases and preferential removal of non-diamond phase.

In one embodiment of a method for manufacturing diamond layers with low near-substrate thermal boundary resistance, in the early (nucleation) phases of diamond growth, chemical-vapor deposition steps of diamond growth are alternated with non-diamond phase in-situ or ex-situ etching using hydrogen or similar gas is used to preferentially etch the non-diamond phases. In one embodiment of the present invention, the growth step adds between 10 nm and 50 nm of diamond, while the etching step removes a part or the entire diamond layer. The growth/etching process repeats until a predetermined total thickness of the diamond film is reached. The alternating process may be stopped and normal continuous growth of diamond may commence when the nucleation surface is completely covered with diamond domains. The nucleation density (number of diamond domains from which new crystals will grow) is related to the domain size distribution on the surface. The thermal boundary resistance increases with the ratio of the nucleation layer thickness to the domain size. It is the objective to reduce this ratio and the described embodiment of the present invention accomplishes this. In one embodiment of the present invention, the total thickness to which the nucleation layer is to be grown is 50 nm. It is also possible to accomplish similar results by exposing the surface to fluorine and, to a certain degree, to oxygen.

Figure 4:
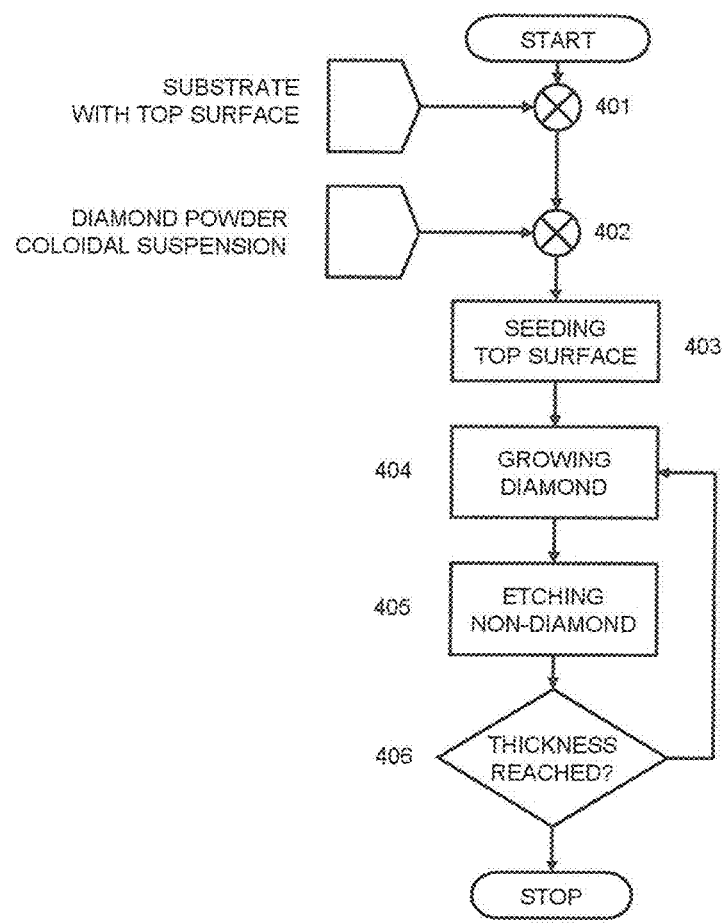
FIG. 4 shows a block diagram illustrating the steps of a second technique for improving near-substrate thermal boundary resistance using an alternating growth and etch procedure during the early stages of diamond growth.

FIG. 4 shows a block diagram illustrating a method as described above. The method for manufacturing diamond layers with low near-substrate thermal boundary resistance comprises steps of providing a substrate with a top surface (401) and a colloidal suspension of diamond particles (402), followed by seeding (403) the top surface with this colloidal suspension, for example using a nanocrystalline diamond powder as previously described, and growing diamond (404). In one embodiment, the top surface is silicon nitride, and yet in another embodiment, the top surface is aluminum nitride. The step of growing diamond (404) is followed by an etching step (405) in which the non-diamond compounds in the CVD grown diamond film are preferentially etched over diamond. The steps of growing and etching are alternatively repeated until a thickness limit (406) is reached. The thickness limit is defined by the desired thickness needed to complete the nucleation. The process of diamond substrate growth is continued once the nucleation phase disclosed in FIG. 4 has completed—past the "STOP" block. The pre-set thickness (the thickness limit) is not smaller than 10 nm.

The impact of this technique in changing the TBR through altering the initial growth phase and thickness is shown in FIGS. 6(C) and 6(D). The TEMs of the interface demonstrate the change in the interface thickness and structure. Correspondingly the TBR values measured through technique developed by Ken Goodson, et al., titled "Experimental investigation of thermal conduction normal to diamond-silicon boundaries" published in Journal of Applied Physics, vol. 77, p. 1385, 1995, confirmed the changes in terms of measured resistance. FIG. 6(C) is a non-etched back, as grown interface with an initial growth region of about 50-nm thickness. This can be identified as region between the straight line towards the bottom of the image (the nucleation surface) and the darker, more circular contrast patterns. The light region above the more circular contrast patterns represents the start of the larger more ordered crystallites that comprise the bulk diamond layer. FIG. 6(D) is a multi-step etched back and re-deposited interface with about 25-nm growth region thickness. Distinctly different TBRs were measured for the two samples at 40.7 and 32.1 $m^2K/GW$ respectively, hence supporting the correlation between the thickness and quality of the initial growth layer and the value of the TBR.

Another embodiment of a method for manufacturing diamond layers with low near-substrate thermal boundary resistance is based on controlling the type of layer that grows once the surface has been pretreated by seeding with diamond powder. A non-diamond surface, in one embodiment a silicon nitride surface, is seeded with a diamond powder which may have an average particle size between a few nanometers and 0.2 µm (micrometers). On this surface, which is now rough, a certain number density of diamond crystals remain attached. These will be the nucleating sites. In one embodiment of the present invention, the seeding is followed by a plasma etch in which several nanometers, preferably less than 10 nm of the revealed silicon nitride surface are etched and blunted. Usually, diamond nucleation occurs at sharp edges on the substrate surface caused by seeding in addition to adhered seed crystals. By selecting a suitable etch to smooth sharp edges on the substrate surface caused by seeding then the proportion of diamond nucleation on the substrate surface relative to adhered seed crystals is reduced. The plasma etching is followed by diamond growth in which the nucleation sites give rise to diamond crystals that grow laterally. In this way, the starting domain sizes adjacent to the substrate surface are made larger and can be better controlled by controlling the seeding density. In one embodiment, the pre-growth etching is performed in an argon plasma, but oxygen, chlorine or fluorine based chemistry etching may be performed to etch substrate surface compounds.

Figure 5:
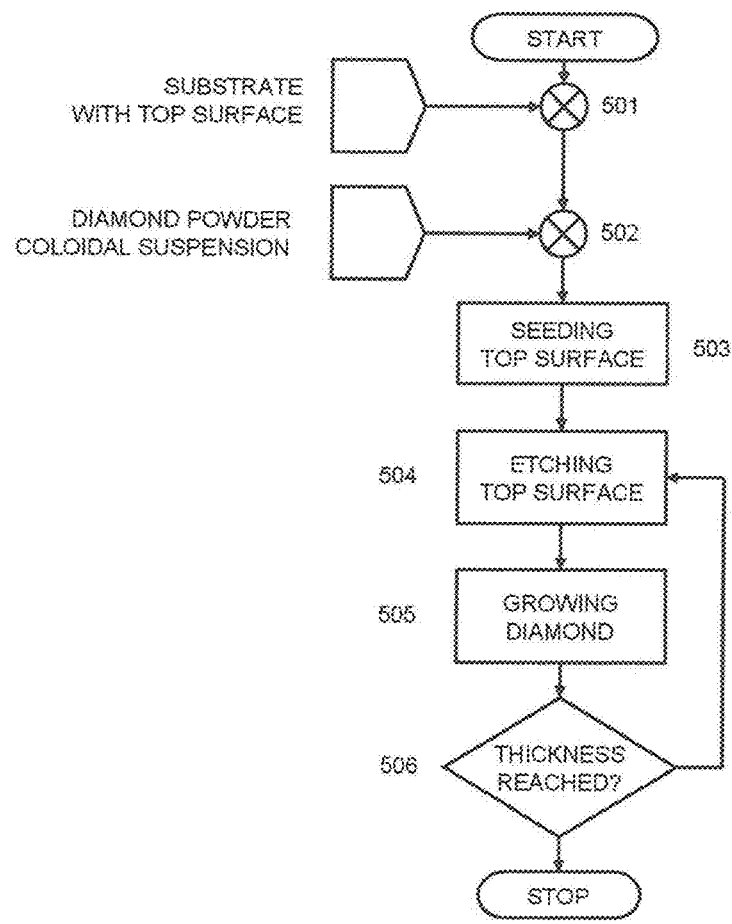
FIG. 5 shows a block diagram illustrating the steps of a third technique for improving near-substrate thermal boundary resistance using a substrate surface etch after seeding and prior to initiation of diamond growth.
Figure 7:
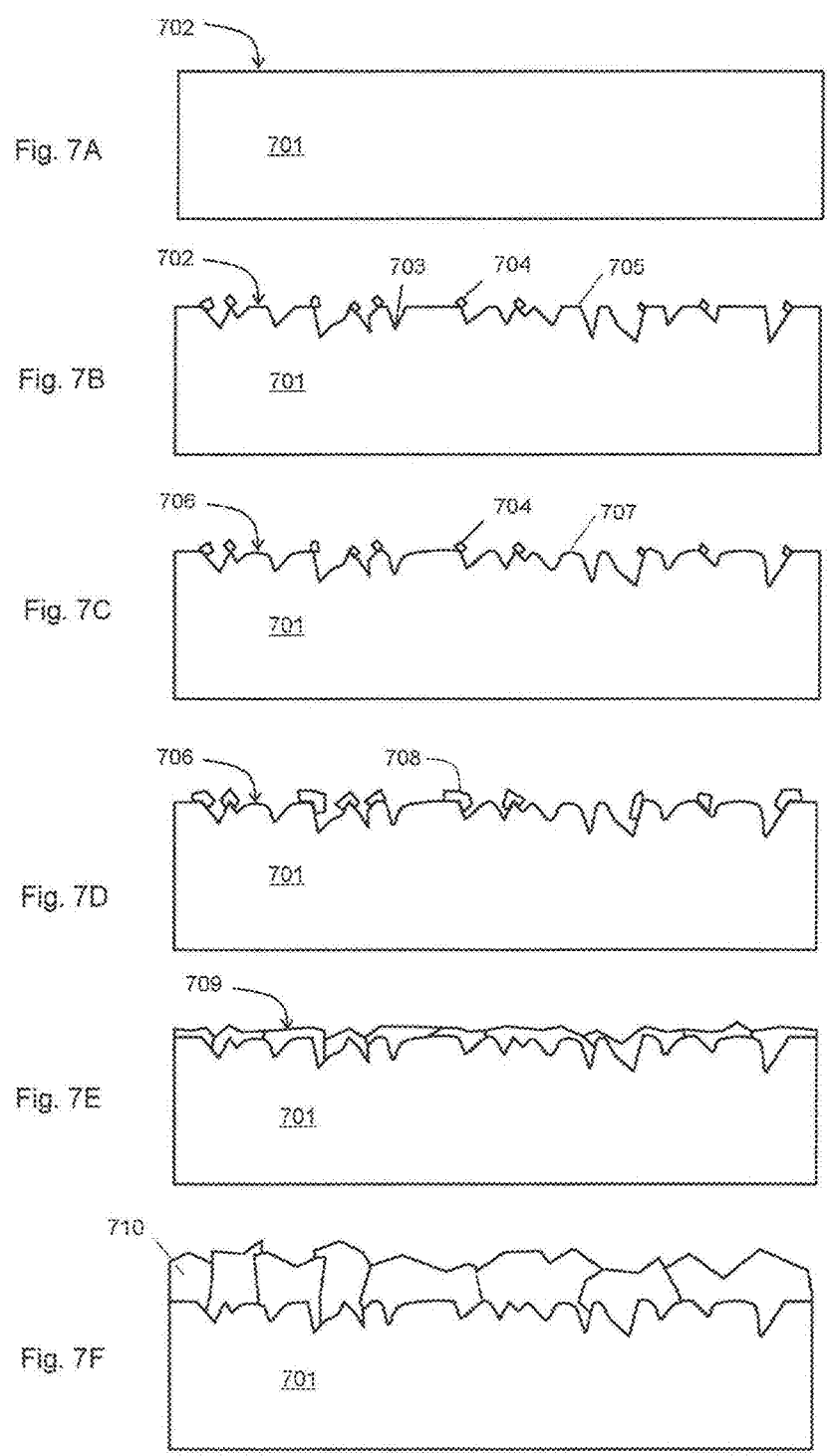
FIGS. 7(A) to 7(F) show illustrations of the structures occurring during the process steps of the method of FIG. 5.

The above described method for manufacturing diamond films with low near-substrate thermal boundary resistance is illustrated with the block diagram shown in FIG. 5 with the corresponding surface structures illustrated in FIG. 7. The process comprises providing a substrate 501 with a top surface and providing a colloidal suspension of diamond powder 502 followed by seeding 503 the substrate top surface. In one embodiment, the diamond power consists of nano-crystalline diamond as previously described. A substrate 701 with a top surface 702, which does not have to be made of the same material as the substrate 701 is provided in FIG. 7A. In one embodiment, the top surface 702 of the substrate is made out of silicon nitride. The seeding step 503 creates scratches 703 and leaves some diamond particles 704 on the scratched surface 702. There is a number of sharp points 705 that remain on the surface 702 and which will become nucleation sites for the upcoming diamond growth. In one embodiment, in step 504 the surface 702 is etched so that the sharp edges 705 get dulled and smoothed out as shown in 707 on the etched surface 706 as shown in FIG. 7(C). In one embodiment the etching is performed with argon plasma, and in yet another embodiment the etching involves fluorine based plasma, such, as $SF_6$, $CF_4$ or similar etchants for silicon compounds. Further, in step 505 CVD diamond growth commences and the diamond growth preferentially occurs on the diamond particles 704 attached to the surface 706 as shown in FIG. 7(D) where the particles 708 have increased in size. No new diamond nucleation occurs in the smoothed areas 706 between the diamond particles 708. With further growth the diamond crystallites 708 become sufficiently large as shown in 709 to coalesce and completely cover the substrate with diamond crystals, as shown in FIG. 7(F), and finally give rise to columnar growth 710 shown in FIG. 7(F). In this way, by limiting the nucleation density the size of the diamond crystals are increased in the immediate proximity of the substrate and thereby the near-substrate thermal resistance of the diamond layers is reduced.

In one embodiment of a method for manufacturing diamond layers with low near-substrate thermal boundary resistance, the substrate on top of which the diamond layers are nucleated and grown may include at least one layer of any materials selected from a group comprising gallium nitride, aluminum nitride, silicon carbide, silicon, and sapphire. In yet another embodiment of the method for manufacturing diamond layers with low near-substrate thermal boundary resistance, the diamond layer may be deposited on completed electronic or optelectronic devices. These devices, as is well known in the art, comprise metal traces, dielectric coatings, and etched areas. Coating diamond films on such structures is highly advantageous as it provides heat spreading from above the device. The boundary between the heat source and the heat-spreading diamond layer on top of such a device is an impediment to thermal management. Any one embodiment of the method for manufacturing diamond layers with low near-substrate thermal boundary resistance may be applied to a surface of a completed electronic or optoelectronic device. The top surface of the devices may be patterned with a variety of materials all of which nucleate diamond. For example, refractory metals can be used to nucleate diamond and passivation dielectric material used in electronic devices, such as silicon nitride, also allow for efficient diamond nucleation. In one embodiment, the top surface of such electronic or optoelectronic devices on top of which diamond layers are to be nucleated comprise at least in part of one of the materials selected from a group consisting of silicon, silicon dioxide, silicon nitride, silicon carbide, aluminum nitride, and a refractory metal.

Void formation, grain size, and nucleation layer thickness parameters as described herein can be measured using microscopy techniques such as optical microscopy, scanning electron microscopy (SEM), and transmission electron microscopy (TEM). Furthermore, the proportion of diamond relative to non-carbon diamond can be measured using spectroscopic technique such as Raman Spectroscopy and Fourier Transform InfraRed (FTIR) Spectroscopy. In this regard, it may be noted that in diamond films grown by CVD, carbon can be incorporated into the film both in diamond and non-diamond forms. Non-diamond carbons may be graphitic or amorphous carbon regions in the film.

It is well known in the industry that diamond can be discriminated from the other carbon forms by Raman Spectroscopy and Fourier Transform InfraRed (FTIR) Spectroscopy. Both of these methods use diamond vibration spectra (phonon spectra) and can be used to discriminate an $sp^3$ orbital hybrid (signature of diamond) from an $sp^2$ orbital hybrid (signature of graphite and amorphous carbon).

Figure 8:
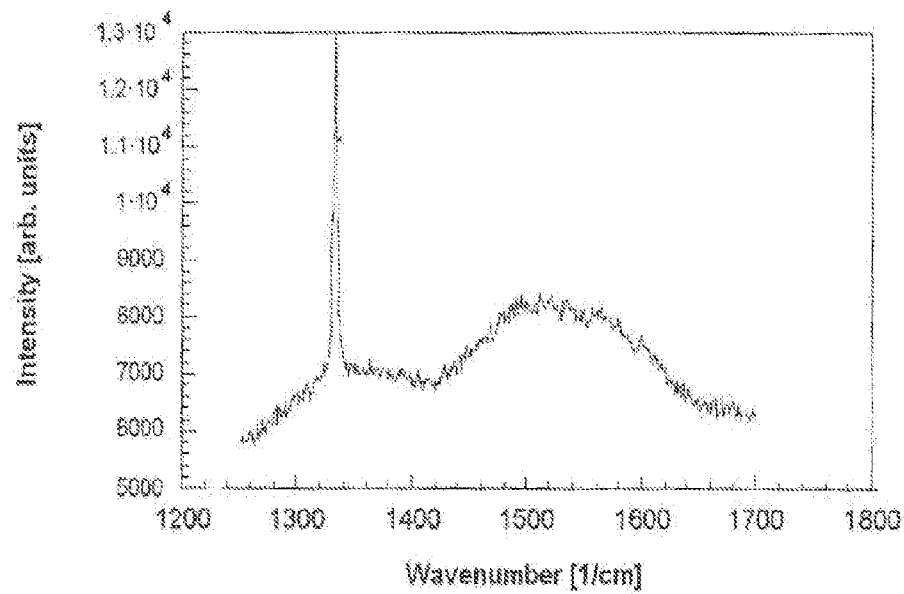
FIG. 8 shows a Raman spectrum of a polycrystalline CVD diamond nucleation layer indicating the sp3 and sp2 peaks (taken at room temperature using an excitation wavelength of 514 nm, a 1 µm spot size, and a 100 µm detector slit width)
Figure 9:
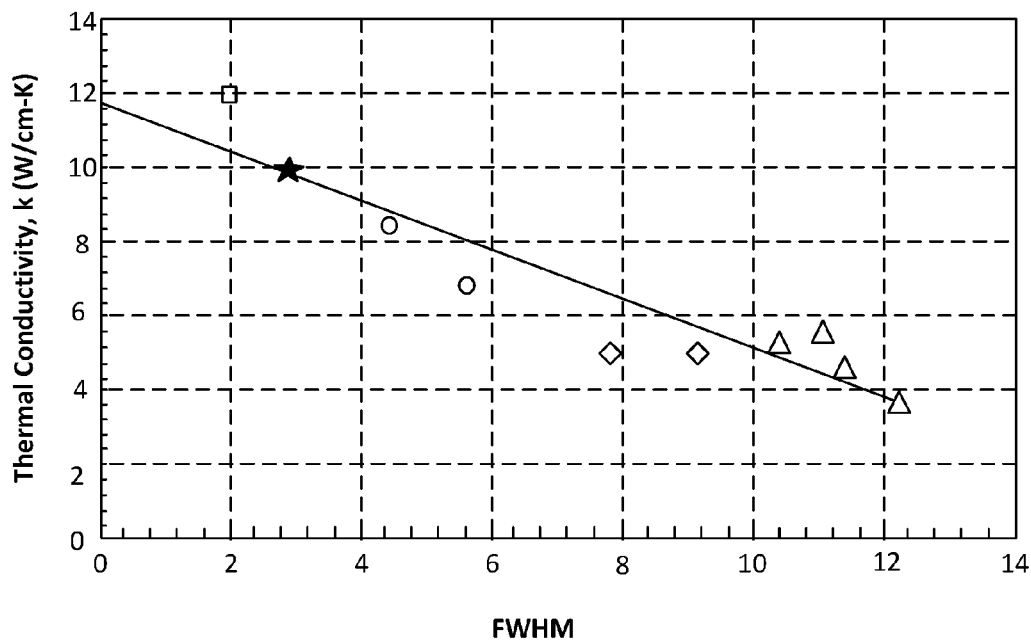
FIG. 9 shows a graph illustrating the correlation between thermal conductivity of a diamond film and the full-width half maximum of the sp3 peak in its Raman spectrum.

In relation to the above, TEM images have already been described with reference to FIGS. 6(A) to 6(C). In addition, FIG. 8 shows an example of a Raman spectrum (514 nm excitation wavelength) of a polycrystalline CVD diamond nucleation layer indicated sp3 and sp2 peaks. The two visible peaks correspond to the diamond-phase (sp3) at approximately 1332 cm$^{-1}$ and non-diamond graphitic carbon at approximately 1550 cm$^{-1}$. The full width half-maximum (FWHM) of the sp3 peak at 1332 cm$^{-1}$ is 2.9 cm$^{-1}$. The thermal conductivity of CVD diamond films is directly related to the fraction of diamond in the film relative to non-diamond material. FIG. 9 shows a graph illustrating the correlation between thermal conductivity of a diamond film and the full-width half maximum of the sp$^3$ peak in its Raman spectrum.

While this invention has been particularly shown and described with reference to embodiments, it will be understood to those skilled in the art that various changes in form and detail may be made without departing from the scope of the invention as defined by the appending claims.

The invention claimed is:

1. A method of fabricating a semiconductor device structure, comprising:
   providing a substrate comprising a layer of III-V compound semiconductor material;
   seeding a surface of said substrate;
   growing a diamond nucleation layer on said surface using a chemical vapour deposition (CVD) technique; and
   growing a layer of polycrystalline CVD diamond material over the diamond nucleation layer,
   wherein the method further comprises applying at least one of the following techniques:
   (a) using a nanocrystalline diamond powder for the seeding step, the nanocrystalline diamond powder having an average particle size of no more than 200 nm and a D90 particle size of no more than 500 nm thereby reducing the size of grooves formed in the substrate surface and consequently reducing void formation during diamond growth thereon when compared with a seeding process which utilizes larger seed particles;
   (b) alternating CVD diamond growth and non-diamond carbon etch steps to fabricate the diamond nucleation layer, wherein the step of alternating comprises (b1) growing a diamond layer of a first thickness by chemical vapor deposition, (b2) etching at least a part of the diamond layer of the first thickness, and (b3) repeating steps (b1) and (b2) until an overall thickness of the diamond nucleation layer reaches a second thickness, wherein step (b2) etches non-diamond phases preferentially over diamond phases thereby increasing a proportion of the diamond phases in the diamond nucleation layer relative to the non-diamond phases; and
   (c) using a pre-growth etching step applied to the substrate surface after seeding the surface and prior to growing the diamond nucleation layer thereon, wherein crystalline seeds are deposited on the substrate surface during seeding and the pre-growth etching step comprises etching using a chemistry which is selected to etch the substrate surface preferentially over crystalline seeds on the substrate surface and to smooth the substrate surface thereby reducing nucleation sites formed by sharp groove edges on the substrate surface relative to nucleation sites provided by the crystalline seeds.

2. The method of claim 1, wherein, in technique (a), an average particle size of the nanocrystalline diamond powder used in the seeding step is no more than 150 nm, 100 nm, 80 nm, 60 nm, 40 nm, 20 nm, or 10 nm and/or no less than 3 nm, 5 nm, or 6 nm.

3. The method of claim 1, wherein, in technique (a), the D90 particle size of the nanocrystalline diamond powder used in the seeding step is no more than 400 nm, 300 nm, 250 nm, 200 nm, 175 nm, or 100 nm.

4. The method of claim 1, wherein, in technique (a), the nanocrystalline diamond powder is suspended in a colloidal suspension for the seeding step.

5. The method of claim 1, wherein, in technique (b), said first thickness is at least 10 nm and less than 50 nm.

6. The method of claim 1, wherein, in technique (b), said second thickness is at least 50 nm.

7. The method of claim 1, wherein, in technique (c), the pre-growth etching step etches the substrate surface by no more than 10 nm.

8. The method of claim 1, wherein two or all three of techniques (a) to (c) are utilized in combination.

9. The method of claim 1, wherein the step of growing the diamond nucleation layer comprises increasing concentration of carbon carrying gas.

* * * * *